United States Patent
Yaung

(10) Patent No.: US 7,329,912 B2
(45) Date of Patent: Feb. 12, 2008

(54) DEVICE AND METHODS FOR CMOS IMAGE SENSOR HAVING BORDERLESS CONTACT

(75) Inventor: Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 138 days.

(21) Appl. No.: 11/202,444

(22) Filed: Aug. 12, 2005

(65) Prior Publication Data

US 2005/0269605 A1 Dec. 8, 2005

Related U.S. Application Data

(62) Division of application No. 10/626,061, filed on Jul. 24, 2003, now Pat. No. 6,946,352.

(51) Int. Cl.
 *H01L 21/336* (2006.01)
(52) U.S. Cl. .................. 257/236; 257/E27.133
(58) Field of Classification Search ........ 257/E27.133, 257/236
 See application file for complete search history.

(56) References Cited

U.S. PATENT DOCUMENTS

| | | | |
|---|---|---|---|
| 3,645,631 A * | 2/1972 | Gupta | 356/136 |
| 3,874,919 A * | 4/1975 | Lehman | 438/439 |
| 4,003,632 A * | 1/1977 | Komiya et al. | 385/2 |
| 6,159,839 A | 12/2000 | Jeng et al. | |
| 6,335,249 B1 | 1/2002 | Thei et al. | |
| 6,444,566 B1 * | 9/2002 | Tsai et al. | 438/634 |
| 6,605,502 B2 | 8/2003 | Iyer et al. | |
| 6,645,868 B1 | 11/2003 | Babcock et al. | |
| 6,743,726 B2 | 6/2004 | Lu et al. | |
| 6,784,094 B2 | 8/2004 | Yin et al. | |
| 6,821,883 B1 | 11/2004 | Babcock et al. | |
| 2002/0090748 A1* | 7/2002 | Lee et al. | 438/30 |

OTHER PUBLICATIONS over. (2003). In The American Heritage® Dictionary of the English Language. Retrieved Jul. 5, 2007, from http://www.credoreference.com/entry/4115456.* adjacent. (2003). In The American Heritage® Dictionary of the English Language. Retrieved Jul. 5, 2007, from http://www.credoreference.com/entry/4058847.*

* cited by examiner

*Primary Examiner*—Thomas L. Dickey
(74) *Attorney, Agent, or Firm*—Slater & Matsil, L.L.P.

(57) ABSTRACT

A photodiode device including a well located in a substrate, a floating node located in the well and shallow trench isolation (STI) regions located over and laterally opposing the floating node. A borderless contact buffer layer is located over at least the floating node, and an interlevel dielectric layer is located over the borderless contact buffer layer. A borderless contact extends through the interlevel dielectric layer and the borderless contact buffer layer to the floating node.

20 Claims, 2 Drawing Sheets

DEVICE AND METHODS FOR CMOS IMAGE SENSOR HAVING BORDERLESS CONTACT

This application is a divisional of patent application Ser. No. 10/626,061, entitled "CMOS Image Sensor Device and Method," filed on Jul. 24, 2003, now U.S. Pat. No. 6,946,352 which application is incorporated herein by reference.

TECHNICAL FIELD

The present invention is directed, in general, to photodiode devices and methods, and, in particular, to CMOS image sensor devices and methods.

BACKGROUND

An image sensor is an apparatus for receiving light, i.e., photons, generated by or reflected from an object, and for generating digital image data. The manufacture of one particular type of image sensor may incorporate conventional complementary metal-oxide-semiconductor (CMOS) fabrication technology. Accordingly, such an image sensor is often referred to as a CMOS image sensor (CIS).

Generally, a CMOS image sensor includes a light sensing region for converting photon energy received from an object to an electrical signal (such as current) and a peripheral circuit region for processing and sending the electrical signal to another device for further processing. A photodiode is formed in the light sensing region, and transistors or other devices may be formed in the peripheral circuit region, thereby forming a semiconductor structure. An interconnect structure including a plurality of insulating layers and metal lines is formed over the semiconductor structure to interconnect the photodiode, transistors and other devices.

However, the design of the interconnect structure is typically based on desired electrical characteristics and device reliability rather than on optical characteristics. As a result, optical transmittance may be degraded by optical reflections at the interfaces between the layers of the semiconductor and interconnect structures.

For example, silicide layers are often employed to improve the electrical coupling of interconnected devices. However, silicides are optically opaque and exhibit excessive junction leakage. Therefore, a shallow-trench-isolation (STI) element may be formed over the photodiode, so that the photodiode is effectively masked during the silicidation process. However, the abrupt transition from the relatively low refractive index silicon dioxide layer to the relatively high refractive index silicon layer may cause high reflection of the optical energy.

Continued scaling of semiconductor devices has introduced the use of borderless contacts (see, e.g., U.S. Pat. No. 6,444,566, to Tsai, et al., commonly assigned herewith and incorporated herein by reference). Borderless contacts require the formation of a buffer layer, typically comprising SiN or SiON, between the STI and the overlying silicon dioxide layer. The borderless contact buffer layer once again introduces optical problems, causing destructive interference attributable to the varying refractive indices of the materials formed over the photodiode. That is, the silicon substrate in which the photodiode is formed has a relatively high refractive index, the STI element formed over the photodiode has a relatively low refractive index, the SiON buffer layer formed over the STI element has a medium refractive index, and the silicon dioxide layer formed over the buffer layer has a relatively low refractive index. Such variation in refractive indices through which impinging light must propagate for effective operation of the photodiode will cause destructive interference of the optical signal, especially for signals having wavelengths approaching the thickness of the STI element.

Accordingly, what is needed in the art is a photodiode device that addresses the problems discussed above.

SUMMARY OF THE INVENTION

To address the above-discussed deficiencies of the prior art, embodiments of the present invention provide a photodiode having reduced optical interference and a method of manufacturing the photodiode. In one embodiment, the photodiode includes a well located in a substrate, a floating node located in the well and shallow trench isolation (STI) regions located over and laterally opposing the floating node. A borderless contact buffer layer is located over at least the floating node, and a dielectric layer is located over the borderless contact buffer layer. A borderless contact extends through the dielectric layer and the borderless contact buffer layer to the floating node.

One embodiment of a method of manufacturing a photodiode according to aspects of the present disclosure includes forming a well in a substrate, forming an STI element at least partially in the well, and removing a portion of the STI element to form STI regions opposing an exposed portion of the well. A floating node is formed in the exposed portion of the well, and a borderless contact buffer layer is formed over at least the floating node and along sidewalls of the STI regions. A dielectric layer is formed over the borderless contact buffer layer, and a borderless contact is formed extending through the dielectric layer and the borderless contact buffer layer to the floating node.

The present disclosure also provides a semiconductor device incorporating a photodiode having reduced optical interference. In one embodiment, the device includes first and second adjacent wells located in a substrate and a transistor gate structure located over at least a portion of the first well. A floating node is located in the second well and STI regions are located over and laterally opposing the floating node. A borderless contact buffer layer is located over at least the floating node and the transistor gate structure, and a dielectric layer is located over the borderless contact buffer layer. A first borderless contact extends through the dielectric layer and the borderless contact buffer layer to the floating node. A second borderless contact extends through the dielectric layer and the borderless contact buffer layer to the transistor gate structure. An interconnect is located over the dielectric layer and couples the first and second borderless contacts.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the present disclosure as a basis for designing or modifying other structures for carrying out the same purposes and/or achieving the same advantages of the present invention. Those skilled in the art should also realize that such equivalent constructions do not depart from the spirit and scope of the present disclosure.

BRIEF DESCRIPTION OF THE DRAWINGS

The present invention is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

Reference is now made to the following descriptions taken in conjunction with the accompanying drawings, in which.

DETAILED DESCRIPTION OF ILLUSTRATIVE EMBODIMENTS

Figure 1:
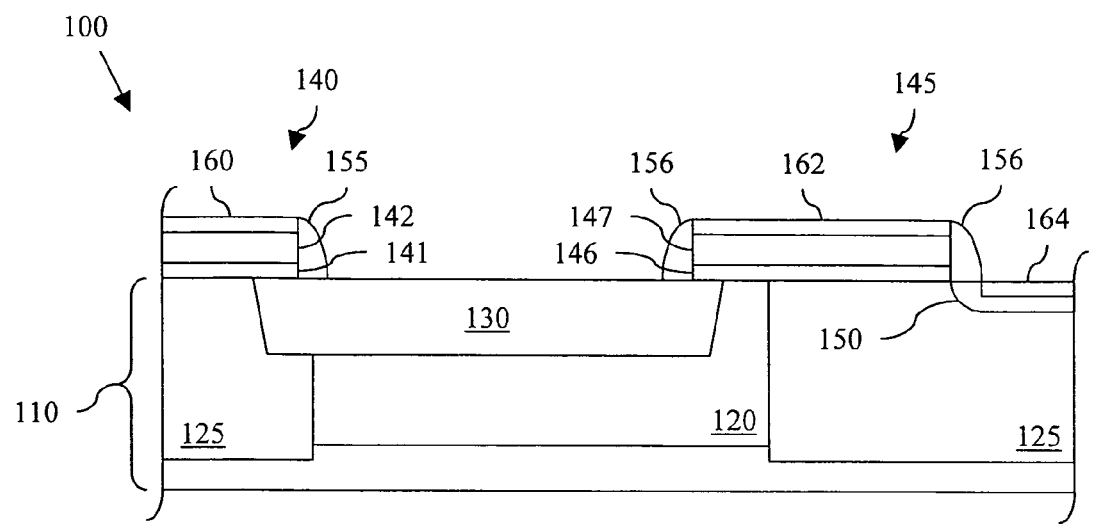
FIG. 1 illustrates a sectional view of one embodiment of a semiconductor device in an intermediate stage of manufacture according to aspects of the present disclosure.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself necessarily dictate a relationship between the various embodiments and/or configurations discussed. Moreover, the formation of a first feature over or on a second feature in the description that follows may include embodiments in which the first and second features are formed in direct physical contact, and may also include embodiments in which additional features may be formed interposing the first and second features, such that the first and second features may not be in direct physical contact.

Referring initially to FIG. 1, illustrated is a sectional view of one embodiment of a semiconductor device 100 in an intermediate stage of manufacture according to aspects of the present disclosure. The device 100 includes a substrate 110 having a well 120 formed therein. The well 120 may be one of many wells formed in the substrate 110. In one embodiment, the well 120 includes a first dopant type and adjacent wells 125 include a second dopant type, such as in a complementary metal-oxide-semiconductor (CMOS) doping scheme. The well 120 may be n-doped, such as with phosphorous or other n–type impurities, or p-doped, such as with boron or other p-type impurities. Alternatively, other MOS devices, such as PMOS or NMOS devices, may be used.

A shallow-trench-isolation (STI) element 130 is formed at least partially in the well 120, possibly extending at least partially into a neighboring well 125. The STI element 130 may be of conventional composition and construction. For example, the STI element 130 may be fabricated by forming an opening in the substrate 110, such as by anisotropic etching, subsequently thermal-oxidizing the inner surfaces of the trench and then filling the trench with an oxide by chemical-vapor deposition (CVD). The STI element 130 may then be completed with a planarizing process, such as by chemical-mechanical polishing (CMP) or plasma etchback. Of course, additional and/or alternative processes may be employed to form the STI element 130 within the scope of the present disclosure. Moreover, electrically insulative structures other than an STI element may be alternatively or additionally formed in the well 120 within the scope of the present disclosure.

Gate structures 140, 145 may then be formed over the substrate 110. The gate structures 140, 145 may be conventional in composition and fabrication. For example, the gate structures 140, 145 may be formed by depositing a gate oxide layer and a gate electrode layer and subsequently patterning these layers to form gate oxides 141, 146 and gate electrodes 142, 147. The gate electrodes 142, 147 may comprise doped polysilicon or other conductive materials. Thereafter, doped regions such as doped region 150 may be formed by conventional or future-developed processes, including ion implantation employing the gate electrode 147 as a mask. The doped regions, such as region 150, may be source/drain regions. Spacers 155, 156 then may be formed, such as by depositing and subsequently etching an insulating layer.

The substrate 110 then may be silicided by conventional or future-developed processes. As such, a silicide layer 160 may be formed over the gate electrode 142, another silicide layer 162 may be formed over the gate electrode 147, and yet another silicide layer 164 may be formed over or in the doped region 150. However, because the STI element 130 and spacers 155, 156 comprise an oxide or other insulating material, no silicide forms over these elements. This may be referred to as a self-aligned silicide, or salicide, process. Although not described herein, those skilled in the art will recognize that additional and/or alternative processes and materials may be employed to form the gate structures 140, 145 and doped region 150 within the scope of the present disclosure.

Figure 2:
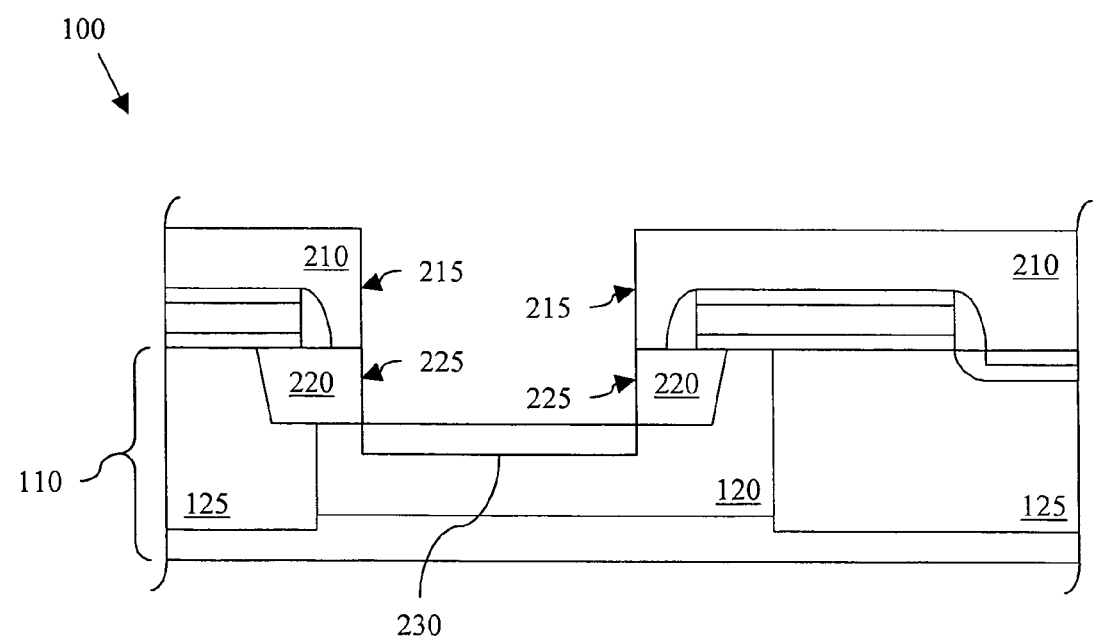
FIG. 2 illustrates a sectional view of the device shown in FIG. 1 in a subsequent stage of manufacture.

Referring to FIG. 2, illustrated is a sectional view of the device 100 shown in FIG. 1 in a subsequent stage of manufacture according to aspects of the present disclosure. After the silicidation process described above, a photoresist layer 210 may be deposited over the substrate 110 and patterned to form sidewalls 215. The patterned photoresist layer 210 may then be employed as a mask to remove a portion of the STI element 130, thereby forming one or more STI regions 220. In the particular embodiment shown in FIG. 2, a central portion of the STI element 130 is substantially removed to form opposing STI regions 220 having sidewalls 225, thereby exposing a portion of the well 120 between the opposing STI regions 220. The portion of the STI element 130 removed to form the STI regions 220 may be removed by an etching process, including a dry or plasma etching process, a wet etching process or a combination thereof.

Subsequently, a floating node 230 may be formed in the exposed portion of the well 120, such as by an ion implant process employing the patterned photoresist layer 210 as a mask. In one embodiment, the floating node 230 is doped to form a higher concentration of the impurity type in the surrounding well 120. For example, if the well 120 is n doped, the floating node 230 may be n+ doped. The ion implant process employed to form the floating node 230 may be substantially similar to the process employed to form the well 120, although some process parameters may be adjusted to achieve the desired dopant concentration. The floating node 230 may also be doped opposite to the surrounding well 120.

Figure 3:
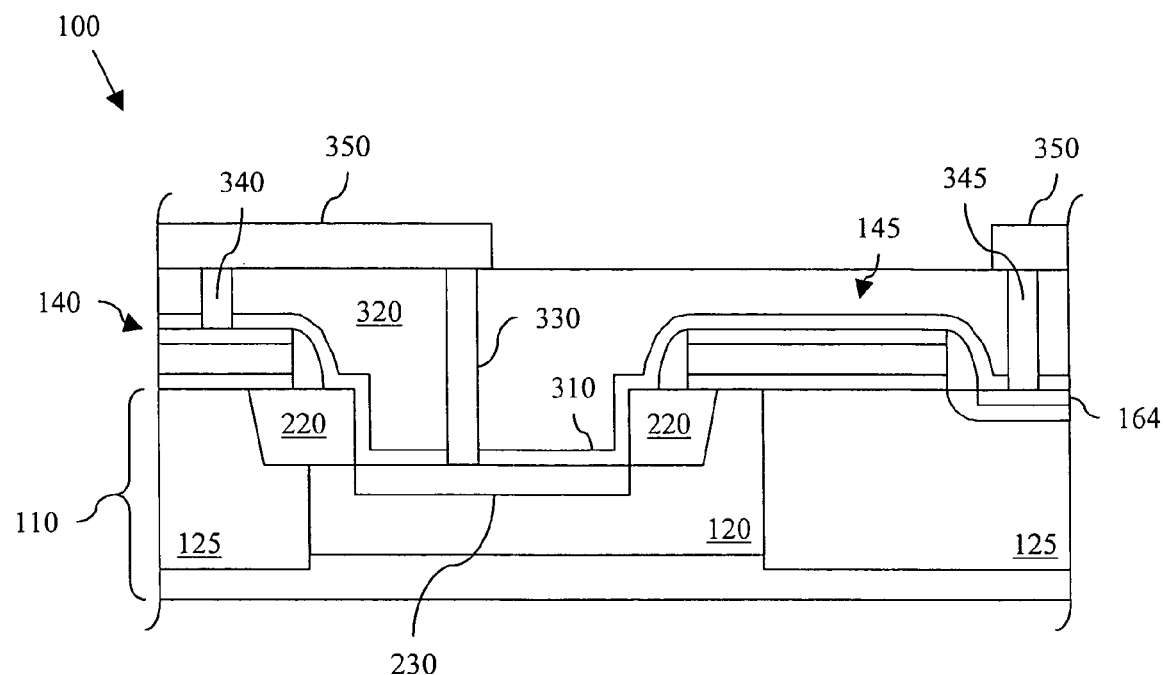
FIG. 3 illustrates a sectional view of the device shown in FIG. 2 in a subsequent stage of manufacture.

Referring to FIG. 3, illustrated is a sectional view of the device 100 shown in FIG. 2 in a subsequent stage of manufacture. After the floating node 230 is formed, the photoresist layer 210 is removed and a borderless contact buffer layer 310 is formed over various features. In the illustrated embodiment, the borderless contact buffer layer 310 is formed over the gate structures 140, 145, the STI regions 220 and their sidewalls 225, the floating node 230 and the silicide layer 164. The borderless contact buffer layer 310 may comprise silicon oxynitride or silicon nitride, and may be formed by chemical-vapor deposition (CVD), plasma enhanced CVD (PECVD) or other processes. The borderless contact buffer layer 310 may have a thickness ranging between about 25 Angstroms and about 500 Angstroms, although other thicknesses are within the scope of the present disclosure.

An insulating layer 320 is then formed over the borderless contact buffer layer 310, such as by spin-on deposition, dry plasma etching, chemical-vapor-deposition, sputter deposition, thermal deposition, evaporation, physical vapor transport or other conventional or future-developed processes. In one embodiment, the insulating layer 320 may be a pre-metal dielectric layer or an interlevel dielectric layer conventionally employed in interconnect structures. For example, the insulating layer 320 may comprise plasma enhanced tetraethylorthosilicate (PETEOS), silicon dioxide or other oxides. In other embodiments, the insulating layer 320 may comprise a low dielectric (low-k) material, which generally includes materials with a dielectric constant less than the dielectric constant of silicon dioxide (e.g., less than about 3.9). Examples include an oxide and methylsilsesquioxane ("MSQ") hybrid, an MSQ derivative, a porogen/MSQa hybrid, an oxide/hydrogen silsesquioxane ("HSQ," also known as hydridosilsesquioxane) hybrid, an HSQ derivative, a porogen/HSQ hybrid, and the like. Other materials, such as nanoporous silica, xerogel, polytetrafluoroethylene ("PTFE"), and low-k dielectrics such as SiLK (available from Dow Chemicals of Midland, Mich.), Flare (available from AlliedSignal of Morristown, N.J., and Black Diamond (available from Applied Materials of Santa Clara, Calif.) may also be employed for the insulating layer 320. The insulating layer 320 may also be planarized, such as by a CMP or plasma etch back process.

A borderless contact 330 may then be formed, extending through the insulating layer 320 and borderless contact buffer layer 310 to the floating node 230. The borderless contact 330 may be fabricated by forming an opening in the insulating layer 320 and borderless contact buffer layer 310 and subsequently filling the opening with gold, copper, aluminum, tungsten, doped silicon or another conductive material. The opening for the borderless contact 330 may be formed by dry-plasma etching or other etching processes, and the conductive material forming the borderless contact 330 may be deposited by CVD, sputter deposition, thermal deposition, evaporation, physical vapor transport or other conventional or future-developed processes. Additional borderless contacts 340, 345 may also be formed, possibly concurrently with the borderless contact 330. For example, in the embodiment shown, a borderless contact 340 extends to the gate structure 140 and another borderless contact 345 extends to the silicide layer 164 formed in or over the doped region 150.

Interconnects 350 are then formed over the insulating layer 320 to interconnect two or more of the borderless contacts 330, 340, 345 or other conductive members of an interconnect structure. For example, as shown in FIG. 3, one of the interconnects 350 couples the gate structure 140 and the floating node 230 via the borderless contacts 330, 340.

Figure 4:
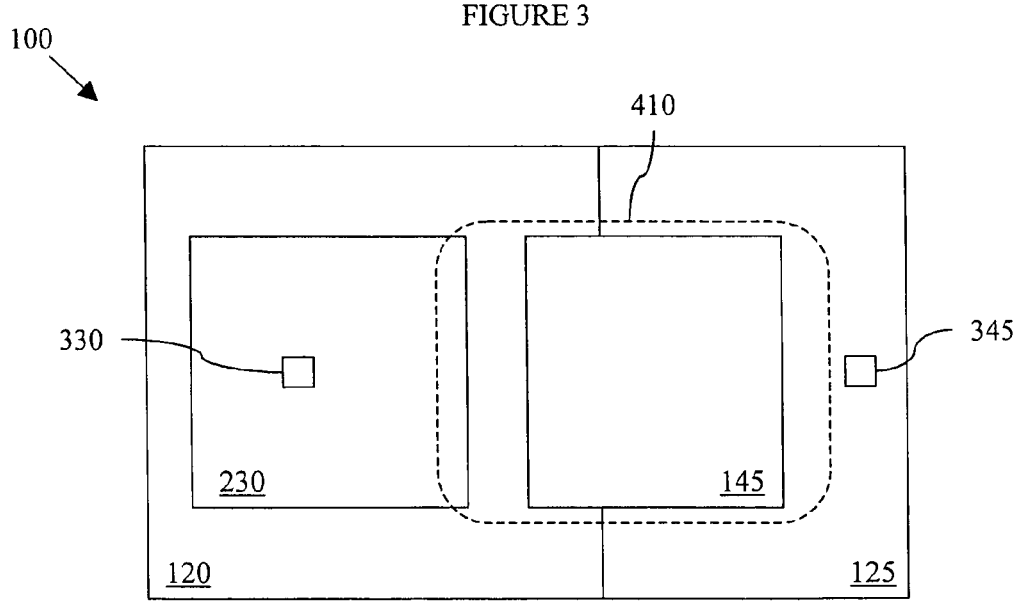
FIG. 4 illustrates a plan view of the device shown in FIG. 3.

Referring to FIG. 4, illustrated is a plan view of the device 100 shown in FIG. 3 to aid in the discussion of the operation and advantages of CIS devices constructed according to aspects of the present disclosure. For the purpose of clarity, some features shown in FIG. 3 are not shown in FIG. 4. Accordingly, only the wells 120, 125, the floating node 230, the borderless contacts 330, 345 and the gate structure 145 from FIG. 3 are also shown in FIG. 4. In addition, an active region 410 of the CIS device 100 is illustrated in FIG. 4. Those skilled in the art will recognize that the active region 410 may not have the well-defined boundaries illustrated in FIG. 4, and that the actual boundaries may vary from those shown among applications and manufacturing lots.

In a preferred embodiment, the borderless contact buffer layer 310 has a medium refractive index that is higher than the low refractive index of the insulating layer 320, but lower than the refractive index of the silicon floating node 230. For example, the insulating layer 320 may have a refractive index ranging between about 1.3 and about 1.5, while the borderless contact buffer layer 310 may have a relatively low refractive index ranging between about 1.8 and about 2.5, and the underlying silicon floating node may have a relatively high refractive index of greater than about 3, such as about 3.4. Therefore the buffer layer 310 provides a gradual transition in refractive indices from the insulating layer 320 to the buffer layer 310 to the underlying silicon.

During operation of the device 100 shown in FIGS. 3 and 4, light impingent on the floating node 230 does not pass directly through an STI element. Instead, the impingent light propagates through the insulating layer 320 and the borderless contact buffer layer 310 to the floating node 230. Because the impingent light passes through materials with gradually increasing refractive indices, destructive interference and high reflection of the impingent light both may be decreased compared to conventional photodiode image sensors.

Moreover, the reduced destructive interference and reflection attainable by aspects of the present disclosure may be achieved with little or no impact to manufacturing time and costs, thereby maintaining or improving product yield. For example, manufacture of a photodiode image sensor or CIS device according to aspects of the present disclosure may be implemented with existing manufacturing processes and materials and may be easily implemented into existing CIS device fabrication procedures.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A photodiode comprising:
   a well located in a substrate;
   a floating node located in the well;
   at least two shallow trench isolation (STI) regions located above the well and having sidewalls, the STI regions laterally opposing the floating node and the sidewalls adjacent two ends of the floating node;
   a borderless contact buffer layer located over at least the floating node;
   a dielectric layer located over the borderless contact buffer layer; and a borderless contact extending through the dielectric layer and the borderless contact buffer layer to and electrically contacting the floating node.

2. The photodiode of claim 1 wherein the borderless contact buffer layer is selected from the group consisting of: SiON, SiN, and combinations thereof.

3. The photodiode of claim 1 wherein the dielectric layer is selected from the group consisting of: silicon dioxide, low dielectric material, and combinations thereof.

4. The photodiode of claim 1 wherein a second refractive index of the borderless contact buffer layer is between a first refractive index of the dielectric layer and a third refractive index of the floating node.

5. The photodiode of claim 1 wherein the dielectric layer has a first refractive index of between about 1.3 and about 1.5, the borderless contact buffer layer has a second refractive index of between about 1.8 and about 2.5, and the floating node has a third refractive index of greater than about 3.

6. The photodiode of claim 1 wherein the well is doped with an n-type impurity and the floating node is doped with an n+type impurity.

7. A semiconductor device, comprising:
first and second adjacent wells located in a substrate;
a first transistor gate structure located over at least a portion of the first well;
a floating node located in the second well;
at least two shallow trench isolation (STI) regions located above the second well having sidewalls, and laterally opposing the floating node and the sidewalls adjacent two ends of the floating node;
a borderless contact buffer layer located over at least the floating node and the first transistor gate structure;
a dielectric layer located over the borderless contact buffer layer;
a first borderless contact extending through the dielectric layer and the borderless contact buffer layer to the floating node;
a second borderless contact extending through the dielectric layer and the borderless contact buffer layer to the first transistor gate structure; and
an interconnect located over the dielectric layer and coupling the first and second borderless contacts.

8. The device of claim 7 wherein the borderless contact buffer layer is selected from the group consisting of: SiON, SiN, and combinations thereof.

9. The device of claim 7 wherein the dielectric layer is selected from the group consisting of: silicon dioxide, low dielectric material, and combinations thereof.

10. The device of claim 7 wherein a second refractive index of the borderless contact buffer layer is between a first refractive index of the dielectric layer and a third refractive index of the floating node.

11. The device of claim 7 wherein the dielectric layer has a first refractive index of between about 1.3 and about 1.5, the borderless contact buffer layer has a second refractive index of between about 1.8 and about 2.5, and the floating node has a third refractive index of greater than about 3.

12. The device of claim 7 wherein the second well is doped with an n-type impurity and the floating node is doped with an n+type impurity.

13. The device of claim 7 wherein the first well is doped with a first impurity type and the second well is doped with a second impurity type opposite to the first impurity type.

14. The device of claim 13 further comprising: a third well doped with the first impurity type and located adjacent the second well on a side opposite the first well; and a second transistor gate structure located over portions of the second and third wells.

15. A CMOS image sensor device, comprising:
a well located in a substrate;
a floating node located in the well having a first refractive index; shallow trench isolation (STI) regions located above the well and having sidewalls, the STI regions laterally opposing the floating node and the sidewalls adjacent two ends of the floating node;
a borderless contact buffer layer located over at least the floating node having a medium refractive index that is lower than the first refractive index;
an insulating layer located over the borderless contact buffer layer having a lower refractive index that is lower than the medium refractive index; and
a borderless contact extending through the insulating layer and the borderless contact buffer layer to the floating node.

16. The CMOS image sensor device of claim 15, wherein the first refractive index is greater than about 3.

17. The CMOS image sensor device of claim 15, wherein the first refractive index is within the range of greater than 3 to about 3.4.

18. The CMOS image sensor device of claim 17, wherein the medium refractive index is within the range of greater than 1.7 to less than 2.6.

19. The CMOS image sensor device of claim 18, wherein the lower refractive index is within the range of greater than about 1.2 to less than 1.6.

20. The CMOS image sensor device of claim 15, wherein the first refractive index is greater than 3, the medium refractive index is between 1.8 to 2.5, the lower refractive index is between 1.3 to 1.5, and wherein the borderless contact buffer layer provides a gradual transition from the refractive index of the insulating lower to the refractive index of the floating node.

* * * * *

UNITED STATES PATENT AND TRADEMARK OFFICE
CERTIFICATE OF CORRECTION

PATENT NO. : 7,329,912 B2  Page 1 of 1
APPLICATION NO. : 11/202444
DATED : February 12, 2008
INVENTOR(S) : Yaung It is certified that error appears in the above-identified patent and that said Letters Patent is hereby corrected as shown below:

Col. 5, line 28, delete "N.J.," and insert --N.J.),--.
Col. 8, line 20, insert new paragraph return before --shallow trench isolation (STI) regions located above the well and having sidewalls, the STI regions laterally opposing the floating node and the sidewalls adjacent two ends of the floating node;--.
Col. 8, line 50, delete "lower" and insert --layer--.

Signed and Sealed this

Twentieth Day of May, 2008

JON W. DUDAS
*Director of the United States Patent and Trademark Office*